United States Patent
Yoshida et al.

(10) Patent No.: US 12,318,946 B2
(45) Date of Patent: Jun. 3, 2025

(54) SUBSTRATE TRANSFER ROBOT AND METHOD OF CONTROLLING THE SAME

(71) Applicant: KAWASAKI JUKOGYO KABUSHIKI KAISHA, Kobe (JP)

(72) Inventors: Masaya Yoshida, Himeji (JP); Junichi Sugahara, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 18/741,045

(22) Filed: Jun. 12, 2024

(65) Prior Publication Data

US 2024/0359330 A1    Oct. 31, 2024

Related U.S. Application Data

(63) Continuation of application No. 17/258,368, filed as application No. PCT/JP2019/026783 on Jul. 5, 2019, now Pat. No. 12,036,680.

(30) Foreign Application Priority Data

Jul. 6, 2018    (JP) ................. 2018-129223

(51) Int. Cl.
*B25J 9/16*    (2006.01)
*B25J 9/00*    (2006.01)
(Continued)

(52) U.S. Cl.
CPC .......... *B25J 9/1682* (2013.01); *B25J 9/0087* (2013.01); *B25J 9/1651* (2013.01); *B25J 9/1664* (2013.01);
(Continued)

(58) Field of Classification Search
CPC ...... B25J 9/1682; B25J 9/0087; B25J 9/1651; B25J 9/1664; B25J 11/0095;
(Continued)

(56) References Cited

U.S. PATENT DOCUMENTS 5,015,177 A  *  5/1991  Iwata ................. H01L 21/68707
                                                                            432/5
5,564,889 A  *  10/1996  Araki ................. H01L 21/68707
                                                                            414/935
(Continued)

FOREIGN PATENT DOCUMENTS

DE      102021214567 A1 *  6/2023
JP      H7-078858 A        3/1995
(Continued)

OTHER PUBLICATIONS

WO-2008140728-A2 translation (Year: 2008).*
(Continued)

*Primary Examiner* — Kyle T Johnson
(74) *Attorney, Agent, or Firm* — Oliff PLC

(57) ABSTRACT

A substrate transfer robot includes a robot body including a first hand having a first substrate placing part on which a substrate is placed and a first substrate holding mechanism configured to hold and release the substrate, and a robot controller. The robot controller controls a speed of the first hand such that an absolute value of a first maximum speed or an absolute value of a first maximum acceleration during a first period after the first hand starts retreating until the substrate is held by the first substrate holding mechanism is lower than an absolute value of a second maximum speed or an absolute value of a second acceleration during a second period after the substrate is held until the first hand ends retreating.

8 Claims, 5 Drawing Sheets

(51) Int. Cl.
*B25J 11/00* (2006.01)
*B25J 15/00* (2006.01)

(52) U.S. Cl.
CPC ........ *B25J 11/0095* (2013.01); *B25J 15/0014* (2013.01)

(58) Field of Classification Search
CPC ...... B25J 15/0014; B25J 9/043; B25J 15/106; B25J 15/0253; G05B 2219/43203; G05B 2219/40454; H01L 21/677; H01L 21/67745; H01L 21/67742; H01L 21/68707
See application file for complete search history.

(56) References Cited

U.S. PATENT DOCUMENTS

| | | | | |
|---|---|---|---|---|
| 5,765,444 | A * | 6/1998 | Bacchi | B25J 9/042 414/744.5 |
| 5,975,834 | A * | 11/1999 | Ogawa | B25J 18/04 414/744.5 |
| 6,485,250 | B2 * | 11/2002 | Hofmeister | B25J 9/06 414/744.1 |
| 10,345,788 | B2 | 7/2019 | Watanabe | B25J 9/1666 |
| 2001/0020199 | A1 * | 9/2001 | Bacchi | B25J 9/042 700/247 |
| 2001/0047225 | A1 * | 11/2001 | Shimoike | G05B 19/41815 700/250 |
| 2003/0053903 | A1 * | 3/2003 | Shanmugasundram | H01L 21/6838 414/744.5 |
| 2006/0130751 | A1 * | 6/2006 | Volfovski | H01L 21/67109 118/300 |
| 2006/0155412 | A1 * | 7/2006 | Ikeda | G05B 19/41865 700/112 |
| 2007/0081881 | A1 * | 4/2007 | Okuno | H01L 21/67167 414/217 |
| 2008/0199283 | A1 * | 8/2008 | Mitsuyoshi | H01L 21/67201 414/222.01 |
| 2009/0087288 | A1 * | 4/2009 | Hofmeister | B25J 18/00 414/222.01 |
| 2010/0247274 | A1 * | 9/2010 | Iizuka | H01L 21/67742 414/217 |
| 2012/0257176 | A1 * | 10/2012 | Hayashi | H01L 21/681 355/27 |
| 2013/0202398 | A1 * | 8/2013 | Watanabe | H01L 21/67742 414/744.6 |
| 2018/0012789 | A1 * | 1/2018 | Handa | B25J 9/042 |
| 2021/0283779 | A1 * | 9/2021 | Yoshida | B25J 9/1664 |
| 2022/0199442 | A1 * | 6/2022 | Sakaue | H01L 21/67754 |
| 2022/0347838 | A1 * | 11/2022 | Hashimoto | B23P 19/06 |
| 2024/0359330 | A1 * | 10/2024 | Yoshida | B25J 9/1651 |
| 2025/0069937 | A1 * | 2/2025 | Takei | H01L 21/68707 |

FOREIGN PATENT DOCUMENTS

| | | | |
|---|---|---|---|
| JP | 2002-071753 | A | 3/2002 |
| JP | 2006-086294 | A | 3/2006 |
| JP | 2009049200 | A | 3/2009 |
| JP | 2017-120850 | A | 7/2017 |
| JP | 6825398 | B2 | 2/2021 |
| KR | 20090013591 | A * | 8/2007 |
| KR | 10-2010-0106906 | A | 10/2010 |
| KR | 20180029364 | A * | 3/2018 |
| KR | 102030051 | B1 | 10/2019 |
| KR | 20230031954 | A * | 3/2023 |
| TW | 322201 | U | 12/1997 |
| WO | 9948652 | A1 | 9/1999 |
| WO | WO-2008140728 | A2 * | 11/2008 ......... B25J 11/0095 |
| WO | 2022078298 | A1 | 4/2022 |

OTHER PUBLICATIONS

KR-20230031954-A translation (Year: 2023).*
KR-20180029364-A translation (Year: 2018).*
DE_102021214567_A1_I_translation (Year: 2012).*
Autonomous Robotic Pick-and-Place of Microobjects (Year: 2010).

* cited by examiner

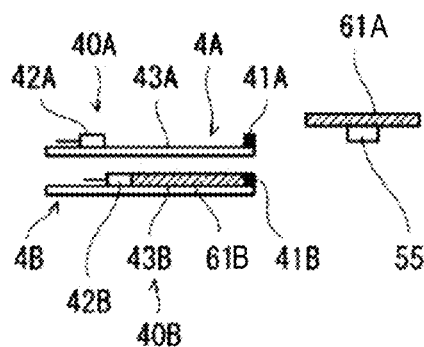
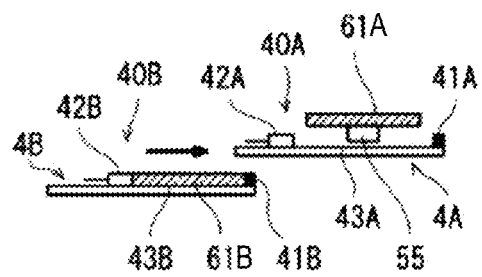
FIG. 4A         FIG. 4B
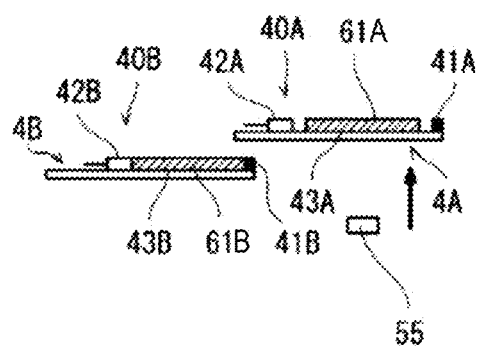
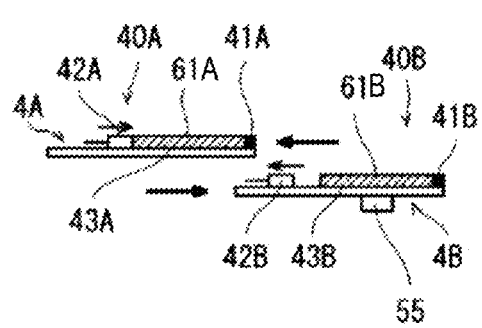
FIG. 4C         FIG. 4D
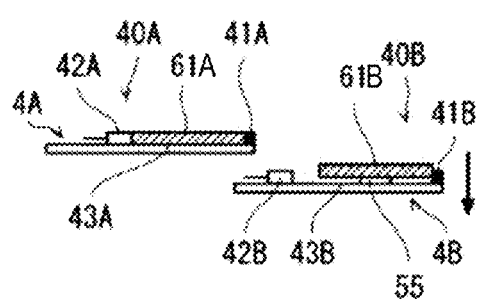
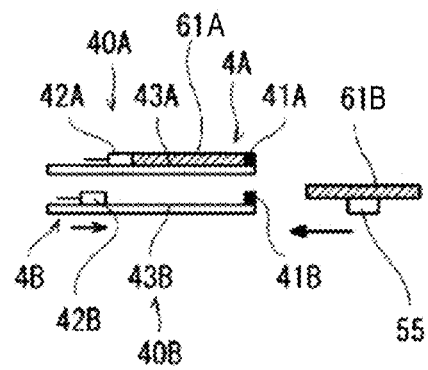
FIG. 4E         FIG. 4F

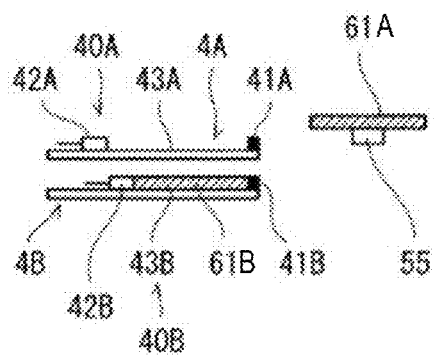
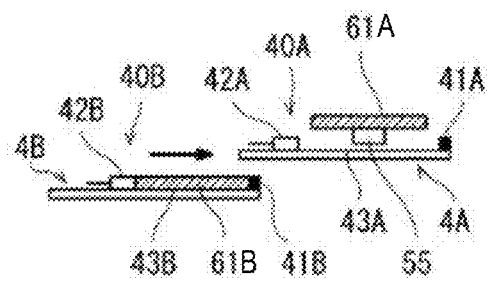
FIG. 5A          FIG. 5B
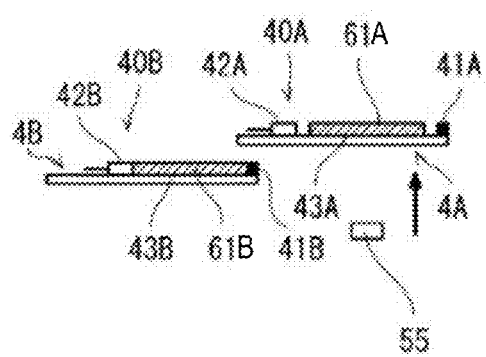
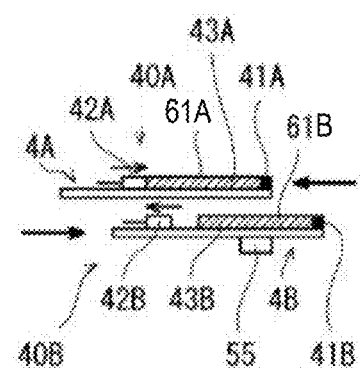
FIG. 5C          FIG. 5D
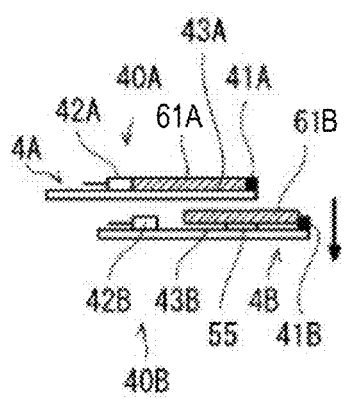
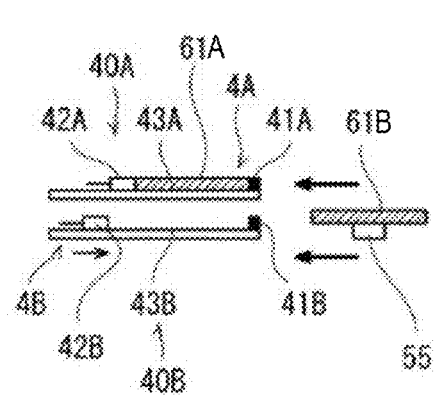
FIG. 5E          FIG. 5F

SUBSTRATE TRANSFER ROBOT AND METHOD OF CONTROLLING THE SAME

CROSS-REFERENCE TO RELATED APPLICATIONS

The present application is a continuation of U.S. patent application Ser. No. 17/258,368, filed on Jan. 6, 2021, which is a national phase application of PCT/JP2019/026783 filed on Jul. 5, 2019, and claims priority to Japanese Patent Application No. 2018-129223 filed on Jul. 6, 2018. The contents of these applications are incorporated herein by reference in their entirety.

TECHNICAL FIELD

The present disclosure relates to a substrate transfer robot and a method of controlling the same.

BACKGROUND ART

Conventionally, a robot which transfers a substrate is used. As one example of such a robot, a substrate transfer device disclosed in Patent Document 1 is known. According to this substrate transfer device, in a passing/receiving operation of a substrate between an indexer robot and a center robot, an indexer upper hand which is empty and an indexer lower hand on which an unprocessed substrate is placed start moving forward so that the indexer upper hand precedes the lower hand. The indexer upper hand reaches a passing/receiving position earlier and receives a processed substrate, and the indexer lower hand then reaches the passing/receiving position. Then, the indexer upper hand starts moving rearward, and the indexer lower hand passes the unprocessed substrate and starts moving rearward. Then, the indexer lower hand moves rearward at high speed so as to catch up with the indexer upper hand, and the both hands are reoriented toward their initial positions. By such a configuration, a substrate transferring time can be reduced as compared with a device in which an indexer upper hand and an indexer lower hand alternately pass an unprocessed substrate and receive a processed substrate. Moreover, since the indexer upper hand is empty when it reaches the substrate passing/receiving position earlier, the substrate will not fall off even if the indexer upper hand reaches the substrate passing/receiving position at the high advancing speed.

REFERENCE DOCUMENT OF CONVENTIONAL ART

Patent Document

[Patent Document 1] JP2006-086294A (see Abstract)

DESCRIPTION OF THE DISCLOSURE

Problems to be Solved by the Disclosure

Patent Document 1 does not describe whether the substrate transfer device (robot) includes a mechanism for holding the substrate on the hand. If the substrate transfer robot includes the mechanism for holding the substrate on the hand (hereinafter, referred to as a "substrate holding mechanism"), the hand on which the substrate is present can be moved forward and rearward at a similar speed to the hand without any substrate. However, for holding the substrate by the substrate holding mechanism, time for holding the substrate is required. If the substrate is simply held by the substrate holding mechanism during the forward/rearward movement of the hand for avoiding an increase in the substrate transferring time due to the time for holding the substrate, the substrate holding mechanism may fail in holding the substrate, at some speeds or accelerations of the hand.

The present disclosure is made to solve the above problems, and one purpose thereof is to provide a substrate transfer robot which includes a hand provided with a substrate holding mechanism, and a method of controlling the same, which can prevent an increase in a substrate transferring time and reduce the possibility that the substrate holding mechanism fails in holding a substrate when the hands are moved forward and rearward.

SUMMARY OF THE DISCLOSURE

In order to solve the problems, a substrate transfer robot according to one aspect of the present disclosure includes a robot body including a first hand having a first substrate placing part on which a substrate is placed and a first substrate holding mechanism configured to hold and release the substrate placed on the first substrate placing part, the first hand being capable of advancing and retreating between a retreated position and an advanced position that are positions in a transferring direction of the substrate, and a robot controller configured to control operations of the first hand and the first substrate holding mechanism. The robot controller operates the first substrate holding mechanism and the first hand so that the first substrate holding mechanism releases the substrate, and the first hand is advanced from the retreated position to the advanced position while the substrate is not placed on the first substrate placing part to place the substrate placed on a substrate placement body on the first substrate placing part at the advanced position, and the first hand is then retreated to the retreated position. The substrate placed on the first substrate placing part is held by the first substrate holding mechanism in a period during which the first hand is retreated. A speed of the first hand is controlled so that an absolute value of a first maximum speed or an absolute value of a first maximum acceleration during a first period after the first hand starts retreating until the substrate is held by the first substrate holding mechanism is lower than an absolute value of a second maximum speed or an absolute value of a second acceleration during a second period after the substrate is held until the first hand ends retreating. Here, the "substrate" includes a wafer, a glass substrate for a liquid crystal display, etc.

According to this configuration, since the substrate placed on the first substrate placing part is held by the first substrate holding mechanism in a period during which the first hand is retreated, a retreating time of the first hand can be shortened as compared with a case where the first substrate holding mechanism holds the substrate placed on the first substrate placing part while the first hand is stopped at the advanced position, and as a result, it can be prevented that a substrate transferring time becomes longer. Moreover, the robot controller causes the first substrate holding mechanism to hold the substrate placed on the first substrate placing part in the period during which the first hand is retreated, and the robot controller controls the speed of the first hand so that the absolute value of the first maximum speed or the absolute value of the first maximum acceleration during the first period after the first hand starts retreating until the substrate is held by the first substrate holding mechanism is lower than the absolute value of the second maximum speed or the absolute value of the second acceleration during the second period after the substrate is held until the first hand ends retreating. Thus, by fully reducing the absolute value of the first maximum speed or the absolute value of the first maximum acceleration during the first period, the possibility that the first substrate holding mechanism fails to hold the substrate placed on the first substrate placing part can be reduced. The "absolute value of the first maximum speed or the absolute value of the first maximum acceleration which can reduce the possibility that the first substrate holding mechanism fails to hold the substrate placed on the first substrate placing part" is set according to experiments, simulations, calculations, etc.

The first period may be a period of time for the first hand to retreat from the advanced position by a given distance.

According to this configuration, since the first hand is retreated by the given distance before the first substrate holding mechanism holds the substrate placed on the first substrate placing part, the retreating time of the first hand can be shortened, as compared with a case where the first hand is stopped at the advanced position until the first substrate holding mechanism holds the substrate placed on the first substrate placing part.

The robot body may further include a second hand having a second substrate placing part on which a substrate is placed, and a second substrate holding mechanism configured to hold and release the substrate placed on the second substrate placing part, the second hand being capable of advancing and retreating between the retreated position and the advanced position below or above the first hand, and the first hand and the second hand being ascendable and descendible together. The robot controller may further control operations of the second hand and the second substrate holding mechanism. The robot controller may cause the second hand to stand by at the retreated position while the substrate placed on the second substrate placing part is held by the second substrate holding mechanism, until the first hand is advanced and reaches the advanced position. When the first hand reaches the advanced position, the first hand and the second hand may be raised by a given raising height to place the substrate placed on the substrate placement body onto the first substrate placing part of the first hand. The second hand may be then advanced to be located at the advanced position and the second substrate holding mechanism may release the substrate, and the first hand may be retreated from the advanced position for the first period and the substrate placed on the first substrate placing part may be held by the first substrate holding mechanism during the first period. The first hand and the second hand may be then lowered by a given lowering height to place the substrate placed on the second substrate placing part of the second hand onto the substrate placement body. The first hand and the second hand may be then retreated to the retreated position.

According to this configuration, with one cycle of operation of the substrate transfer robot, the substrate placed on the substrate placement body can be collected by the first hand, while another substrate is newly placed on the substrate placement body by the second hand.

In addition, since the substrate placed on the second substrate placing part of the second hand is placed onto the substrate placement body, and the first hand and the second hand are then retreated to the retreated position, the first hand may be retreated to the retreated position during retreating of the second hand. Therefore, in the period during which the first hand is retreated, even if the absolute value of the first maximum speed or the absolute value of the first maximum acceleration during the first period is lower than the absolute value of the second maximum speed or the absolute value of the second maximum acceleration during the second period, the substrate transfer time is not increased as compared with a case where the first hand is retreated at a higher speed or higher acceleration.

Moreover, a method of controlling a substrate transfer robot according to another aspect of the present disclosure is a method of controlling a substrate transfer robot including a robot body including a first hand having a first substrate placing part on which a substrate is placed and a first substrate holding mechanism configured to hold and release the substrate placed on the first substrate placing part, the first hand being capable of advancing and retreating between a retreated position and an advanced position that are positions in a transferring direction of the substrate, and a robot controller configured to control operations of the first hand and the first substrate holding mechanism. The method includes the step of operating, by the robot controller, the first substrate holding mechanism and the first hand so that the first substrate holding mechanism releases the substrate, and the first hand is advanced from the retreated position to the advanced position while the substrate is not placed on the first substrate placing part to place the substrate placed on the substrate placement body on the first substrate placing part at the advanced position, and the first hand is then retreated to the retreated position. The method includes the step of holding, by the first substrate holding mechanism, the substrate placed on the first substrate placing part in a period during which the first hand is retreated. The method includes the step of controlling a speed of the first hand so that an absolute value of a first maximum speed or an absolute value of a first maximum acceleration during a first period after the first hand starts retreating until the substrate is held by the first substrate holding mechanism is lower than an absolute value of a second maximum speed or an absolute value of a second acceleration during a second period after the substrate is held until the first hand ends retreating.

According to this configuration, it can be prevented that the substrate transferring time becomes long. Moreover, by fully reducing the first maximum speed or the first maximum acceleration during the first period, the possibility that the first substrate holding mechanism fails to hold the substrate placed on the first substrate placing part can be reduced.

Effect of the Disclosure

The present disclosure can provide a substrate transfer robot which includes a hand provided with a substrate holding mechanism, and a method of controlling the same, which can prevent that a substrate transferring time becomes longer and reduce the possibility that the substrate holding mechanism fails to hold a substrate when advancing and retreating the hand.

BRIEF DESCRIPTION OF DRAWINGS

FIG. 1(A) is a plan view and FIG. 1(B) is a side view.

FIGS. 4(A) to 4(F) are view schematically illustrating one example of a substrate exchange operation of a substrate transfer robot of a comparative example.

FIGS. 5(A) to 5(F) are views schematically illustrating one example of a substrate exchange operation of the substrate transfer robot of FIGS. 1(A) and 1(B).

MODES FOR CARRYING OUT THE DISCLOSURE

Figure 1A:
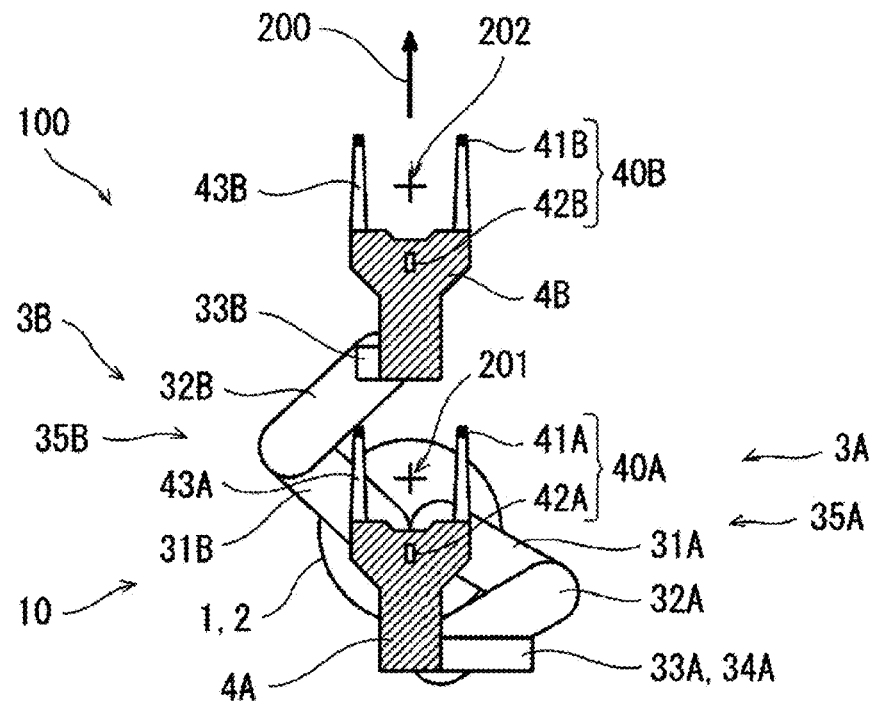
FIGS. 1(A) and 1(B) are views illustrating one example of a configuration of hardware of a substrate transfer robot according to one embodiment of the present disclosure, where

Hereinafter, a desirable embodiment of the present disclosure is described with reference to the drawings. Note that, below, the same reference characters are given to the same or corresponding elements throughout the drawings to omit redundant description. Moreover, since the accompanying drawings are to illustrate the present disclosure, elements irrelevant to the present disclosure may be omitted, a plurality of drawings do not match with each other because of exaggeration etc., and dimension may be inaccurate. Further, the present disclosure is not limited to the following embodiment.

Embodiment

[Configuration]

Figure 1B:
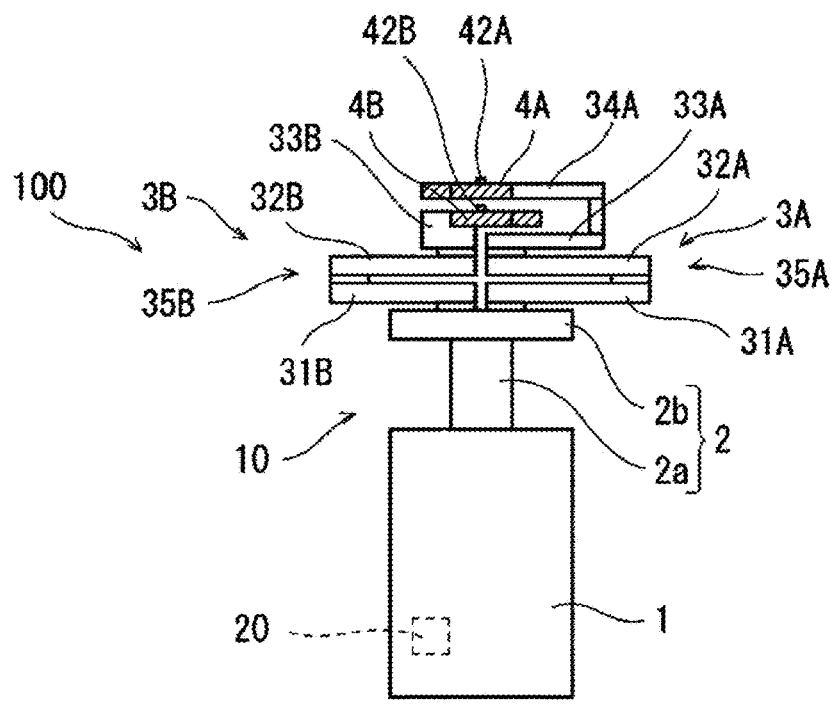

FIGS. 1(A) and 1(B) are views illustrating one example of a configuration of hardware of a substrate transfer robot according to one embodiment of the present disclosure, where FIG. 1(A) is a plan view and FIG. 1(B) is a side view. FIG. 1(B) is a drawing in which a substrate transfer robot 100 of FIG. 1(A) is seen in a substrate transferring direction 200 of FIG. 1(A). Moreover, in FIGS. 1(A) and 1(B), and 2, in order to easily distinguish an upper hand 4A and a lower hand 4B, hatching is given to these parts.

Referring to FIGS. 1(A) and 1(B), the substrate transfer robot 100 of this embodiment includes a robot body 10 provided with a first hand (4A or 4B) having a first substrate placing part (43A or 43B) on which a substrate (not illustrated in FIGS. 1(A) and 1(B)) is placed, and a first substrate holding mechanism (40A or 40B) which holds and releases the substrate placed on the first substrate placing part (43A or 43B). The first hand (4A or 4B) moves forward (advances) and moves rearward (retreats) between a retreated position 201 and an advanced position 202 which are positions in the substrate transferring direction 200. The substrate transfer robot 100 also includes a robot controller 20 which controls operations of the first hand (4A or 4B) and the first substrate holding mechanism (40A or 40B). Moreover, the robot body 10 further includes a second hand (4B or 4A) having a second substrate placing part (43B or 43A) on which a substrate is placed, and a second substrate holding mechanism (40B or 40A) which holds and releases the substrate placed on the second substrate placing part (43B or 43A). The second hand (4B or 4A) advances and retreats between the retreated position 201 and the advanced position 202, below the first hand (4A or 4B). The robot body 10 is configured so that the first hand (4A or 4B) and the second hand (4B or 4A) ascend and descend together, and the robot controller 20 controls operations of the second hand (4B or 4A) and the second substrate holding mechanism (40B or 40A).

In other words, the first hand is a hand which collects the substrate and the second hand is a hand which places the substrate. Since the substrate transfer robot 100 is a dual-arm robot, either hand may function as the first hand or the second hand. Therefore, below, two hands are first identified based on differences in the configuration, and how the identified two hands function as either one of the first hand and the second hand is described.

In this embodiment, the substrate is described as a circular wafer.

Below, one example of a concrete configuration of the substrate transfer robot 100 of this embodiment is described in detail.

The substrate transfer robot 100 is comprised of a dual-arm robot provided with a pair of horizontal articulated arms 3A and 3B. The substrate transfer robot 100 has a pedestal 1. A hoisting body 2 is provided to the pedestal 1. The hoisting body 2 includes a cylindrical elevatable shaft 2a provided to the pedestal 1 so as to be ascendable and descendible, and a rotary body 2b provided as to swivelable on a first rotation axis which is in agreement with a center axis of the elevatable shaft 2a. The upper arm 3A and the lower arm 3B are provided to the rotary body 2b.

The upper arm 3A includes an upper first link 31A which is provided at one of end parts to a suitable place of the rotary body 2b so as to be rotatable on a second rotation axis parallel to the first rotation axis, an upper second link 32A provided at one of end parts to the other end part of the upper first link 31A so as to be rotatable on a third rotation axis parallel to the second rotation axis, an upper third link 33A provided at one of end parts to the other end part of the upper second link 32A so as to be rotatable on a fourth rotation axis parallel to the third rotation axis, an upper fourth link 34A provided at one of end parts to the other end part of the upper third link 32A so as to be rotatable on a fifth rotation axis parallel to the fourth rotation axis, and the upper hand 4A fixed to the upper fourth link 34A. The upper first to fourth links 31A-34A constitute an upper arm part 35A.

The lower arm 3B includes a lower first link 31B provided at one of end parts to the rotary body 2b so as to be rotatable on a sixth rotation axis parallel to the first rotation axis. The lower first link 31B is provided so that the sixth rotation axis becomes point symmetry with the second rotation axis of the first link 31A of the upper arm 3A with respect to the center shaft of the rotary body 2b. The lower arm 3B further includes a lower second link 32B provided at one of end parts to the other end part of the lower first link 31B so as to be rotatable on a seventh rotation axis parallel to the sixth rotation axis, a lower third link 33B provided at one of end parts to the other end part of the lower second link 32B so as to be rotatable on an eighth rotation axis parallel to the seventh rotation axis, and the lower hand 4B fixed to the lower third link 33B. The lower first to third links 31B-33B constitute a lower arm part 35B.

The links 31A-34A which constitute the upper arm part 35A and the links 31B-33B which constitute the lower arm part 35B are each comprised of a horizontal plate member.

The upper hand 4A and the lower hand 4B are each comprised of a plate member and formed substantially in a Y-shape in a plan view. The upper hand 4A and the lower hand 4B are provided with the upper substrate holding mechanism 40A and the lower substrate holding mechanism 40B, respectively. The upper substrate holding mechanism 40A and the lower substrate holding mechanism 40B are, for example, each comprised of a gripping mechanism which grips the substrate. Note that the upper substrate holding mechanism 40A and the lower substrate holding mechanism 40B may be, for example, each comprised of a suction mechanism which sucks and releases the substrate.

A pair of tip-end parts of the upper hand 4A are provided with a pair of positioning parts 41A which position the substrate in a direction toward the tip end of the upper hand 4A from the base end. A pressing part 42A, which presses and does not press the substrate by advancing and retreating in the direction toward the tip end of the upper hand 4A from the base end and in the opposite direction, is provided to a substantially center part of the upper hand 4A. For example, the pressing part 42A is advanced and retreated by a power source, such as an air cylinder and a motor. The pair of positioning parts 41A and the pressing part 42A constitute the upper substrate holding mechanism 40A. Moreover, a part between the pressing part 42A in an upper surface of the upper hand 4A and the pair of positioning parts constitutes an upper substrate placing part 43A. When the pressing part 42A advances and presses the substrate placed on the upper substrate placing part 43A, the substrate is pressed against the pair of positioning parts 41A by the pressing part 42A, and is then gripped by the pressing part 42A and the pair of positioning parts 41A. Moreover, when the pressing part 42A retreats, the gripped substrate is released.

A pair of tip-end parts of the lower hand 4B are provided with a pair of positioning parts 41B which position the substrate in a direction toward the tip end of the lower hand 4B from the base end. A pressing part 42B, which presses and does not press the substrate by advancing and retreating in the direction toward the tip end of the lower hand 4B from the base end and in the opposite direction, is provided to a substantially center part of the lower hand 4B. For example, the pressing part 42B is advanced and retreated by a power source, such as an air cylinder and a motor. The pair of positioning parts 41B and the pressing part 42B constitute the lower substrate holding mechanism 40B. Moreover, a part between the pressing part 42B in an upper surface of the lower hand 4B and the pair of positioning parts 41B constitutes a lower substrate placing part 43B. When the pressing part 42B advances and presses the substrate placed on the lower substrate placing part 43B, the substrate is pressed against the pair of positioning parts 41B by the pressing part 42B, and is then gripped by the pressing part 42B and the pair of positioning parts 41B. Moreover, when the pressing part 42B retreats, the gripped substrate is released.

FIGS. 1(A) and 1(B) illustrate the substrate transfer robot 100 in a state where the upper hand 4A and the lower hand 4B are positioned at the retreated position 201 and the advanced position, respectively. The robot controller 20 controls operations of the upper arm 3A and the lower arm 3B at the retreated position 201 and the advanced position 202 so that the center lines of both the upper hand 4A and the lower hand 4B are in agreement with each other, and these center lines passes through the first rotation axis of the rotary body 2b and are oriented toward the given substrate transferring direction 200.

The retreated position 201 and the advanced position 202 are suitably set according to the operating mode of the substrate transfer robot 100. The retreated position 201 and the advanced position 202 are set on a straight line which passes through the first rotation axis of the rotary body 2b in the plan view.

In the substrate transfer robot 100, either one of the upper hand 4A and the lower hand 4B may be the first hand or the second hand.

The robot controller 20 is disposed, for example, inside the pedestal 1 of the robot body 10. Of course, the robot controller 20 may be disposed at a location distant from the robot body 10.

[Operating Environment]

Figure 2:
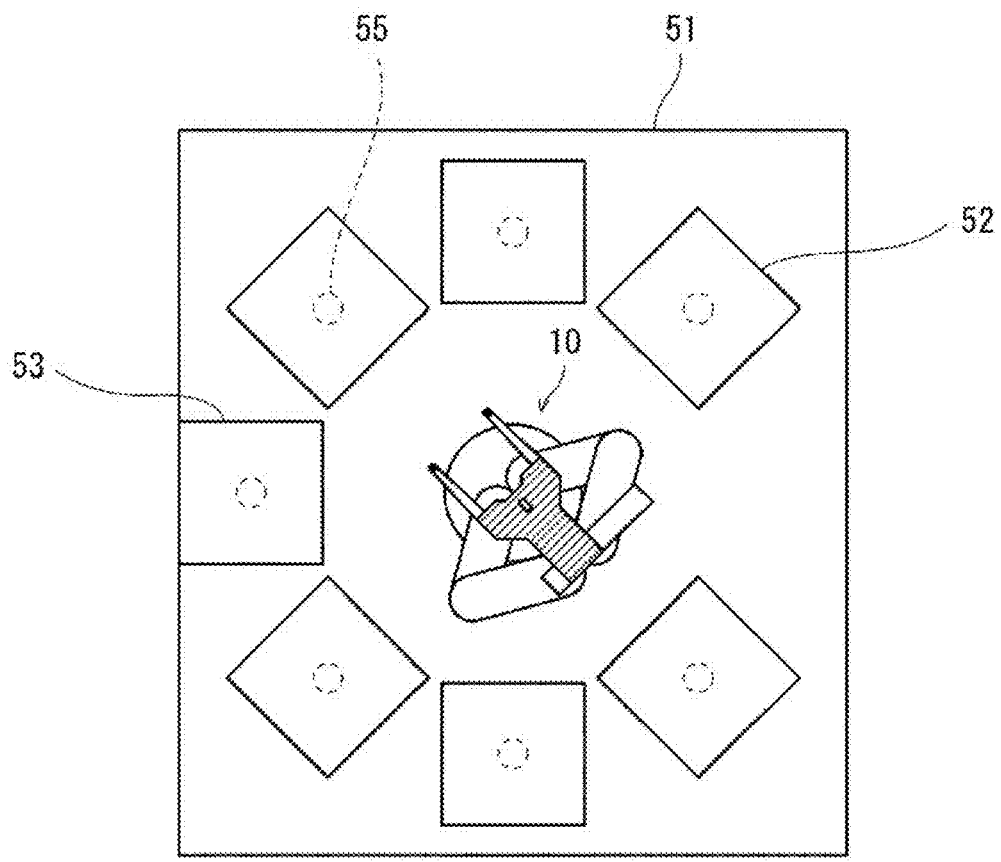
FIG. 2 is a plan view schematically illustrating one example of an operating environment of the substrate transfer robot of FIGS. 1(A) and 1(B).

FIG. 2 is a plan view schematically illustrating one example of an operating environment of the substrate transfer robot of FIGS. 1(A) and 1(B). Referring to FIG. 2, the operating environment of the substrate transfer robot 100 is as follows, for example.

The robot body 10 of the substrate transfer robot 100 is disposed in a vacuum chamber 51. A plurality of substrate treatment tubs 52 and one substrate delivery tub 53 are disposed around the robot body 10. In the plurality of substrate treatment tubs 52, various kinds of substrate treatments are performed. The plurality of substrate treatment tubs 52 and the substrate delivery tub 53 are each provided with a substrate placement body 55. For example, the substrate placement body 55 is formed in a pillar body which stands from a floor of each of the tubs 52 and 53. In this case, an upper surface of the substrate placement body 55 supports the center part of the substrate (not illustrated in FIG. 2). Note that the substrate placement body 55 may be comprised of a flat plate provided so as to protrude horizontally from a side wall of each of the tubs 52 and 53. In this case, the upper surface of the substrate placement body supports an outer circumferential part of the substrate. Note that a front surface of each of the plurality of substrate treatment tubs 52 and the substrate delivery tub 53 (a surface which opposes to the robot body 10) is provided with an opening-and-closing mechanism (not illustrated) which opens and closes the front surface.

In the plan view, a direction toward the center of the substrate placement body of each of the tubs 52 and 53 from the center (first rotation axis) of the rotary body 2b (see FIGS. 1(A) and 1(B)) of the robot body is the substrate transferring direction 200 (see FIG. 1(A)), and, for example, the center of the substrate placement body of each of the tubs 52 and 53 is set as the advanced position 202 (see FIG. 1(A)). The advanced position 202 may differ among the tubs 52 and 53.

The robot body 10 performs a substrate exchange operation in which the upper hand 4A and the lower hand 4B are turned so that the substrate transferring direction 200 is oriented toward a certain substrate treatment tub 52, the upper hand 4A receives a processed substrate placed on the substrate placement body 55, and an unprocessed substrate held by the lower hand 4B is placed on the substrate placement body 55. Then, it performs the substrate exchange operation in which the upper hand 4A and the lower hand 4B are turned so that the substrate transferring direction 200 is oriented toward the substrate delivery tub 53, the lower hand 4B receives the unprocessed substrate placed on the substrate placement body 55, and the processed substrate held by the upper hand 4A is placed on the substrate placement body 55.

That is, in the operating environment of the robot body 10 illustrated in FIG. 2, during the substrate exchange operation with the substrate treatment tub 52, the upper hand 4A functions (operates) as the first hand, and the lower hand 4B functions (operates) as the second hand. On the other hand, during the substrate exchange operation with the substrate delivery tub 53, the lower hand 4B functions (operates) as the first hand, and the upper hand 4A functions (operates) as the second hand.

[Configuration of Control System]

Figure 3:
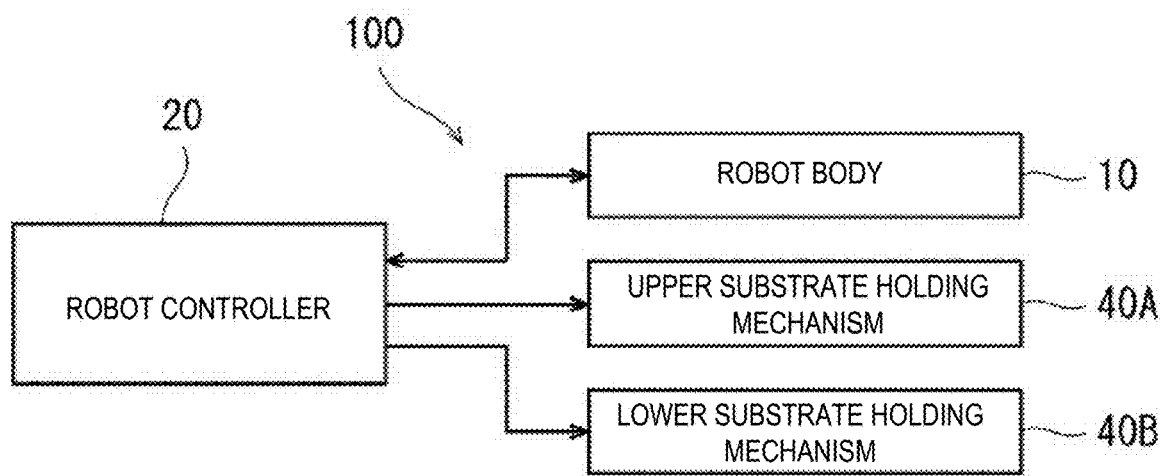
FIG. 3 is a functional block diagram illustrating a configuration of a control system of the substrate transfer robot of FIGS. 1(A) and 1(B).

FIG. 3 is the functional block diagram illustrating a configuration of a control system of the substrate transfer robot 100 of FIGS. 1(A) and 1(B). Referring to FIG. 3, the robot controller 20 carries out a feedback control of the operation of the robot body 10. Moreover, the robot controller 20 controls the operations of the upper substrate holding mechanism 40A and the lower substrate holding mechanism 40B.

For example, the robot controller 20 includes a processor and a memory. The robot controller 20 controls the operations of the robot body 10, the upper substrate holding mechanism 40A, and the lower substrate holding mechanism 40B by the processor reading and executing a given operation program stored in the memory. In detail, the robot controller 20 is comprised of, for example, a microcontroller, an MPU, an FPGA (Field Programmable Gate Array), a PLC (Programmable Logic Controller), or a logic circuit.

[Operation]

Next, the operation of the substrate transfer robot 100 configured as described above (a method of controlling the substrate transfer robot 100) is described as compared with a substrate transfer robot of a comparative example.

<Substrate Exchange Operation to Substrate Treatment Tub 52>

First, the substrate exchange operation to the substrate treatment tub 52 is described.

Figure 6:
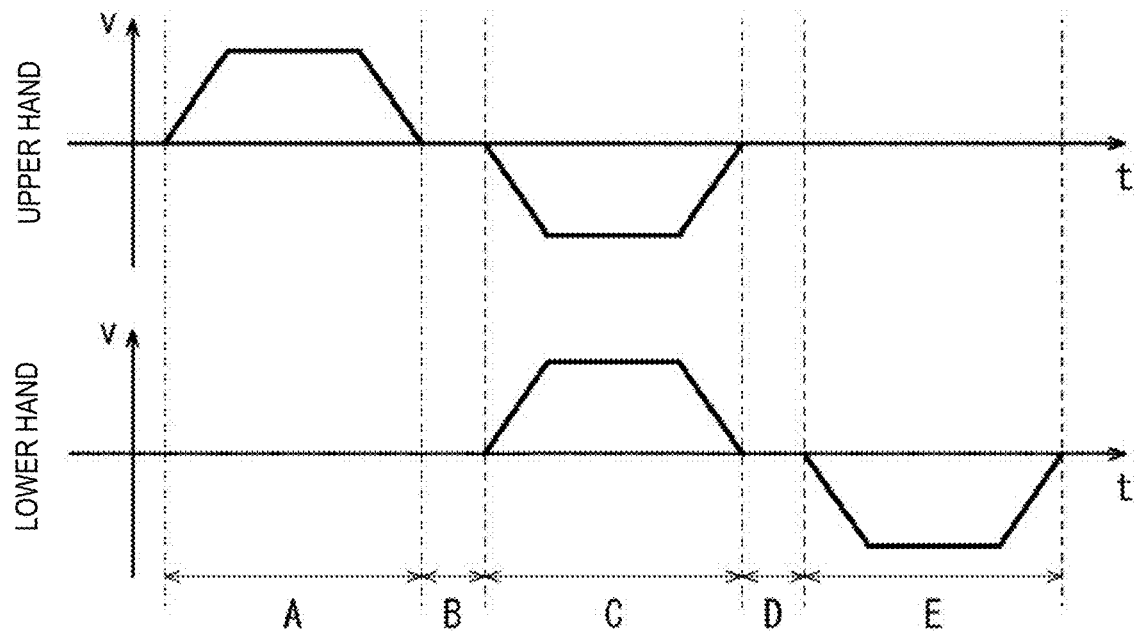
FIG. 6 is a graph illustrating speed changes of hands during the substrate exchange operation of the substrate transfer robot of the comparative example.
Figure 7:
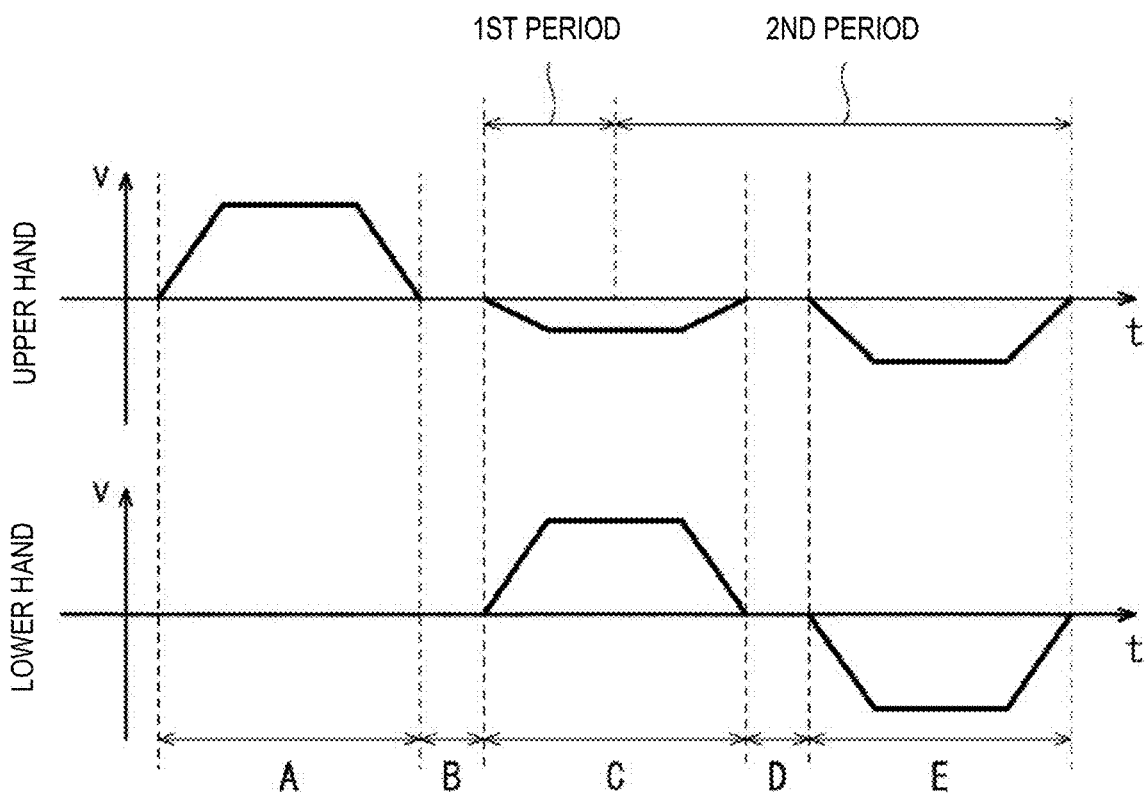
FIG. 7 is a graph illustrating speed changes of hands during the substrate exchange operation of the substrate transfer robot of FIGS. 1(A) and 1(B).

FIGS. 4(A) to 4(F) are views schematically illustrating one example of the substrate exchange operation of the substrate transfer robot of the comparative example. FIGS. 5(A) to 5(F) are views schematically illustrating one example of the substrate exchange operation of the substrate transfer robot of FIGS. 1(A) and 1(B). FIG. 6 is a graph illustrating speed changes of the hands during the substrate exchange operation of the substrate transfer robot of the comparative example. FIG. 7 is a graph illustrating speed changes of the hands during the substrate exchange operation of the substrate transfer robot of FIGS. 1(A) and 1(B). Note that in FIGS. 4(A) to 4(F) and FIGS. 5(A) to 5(F), the retreated position and the advanced position are drawn closer than those in FIG. 2 for facilitating understandings of the drawings. Moreover, in FIGS. 6 and 7, positive speeds represent advancing speeds of the upper hand 4A and the lower hand 4B, and negative speeds represent retreating speeds of the upper hand 4A and the lower hand 4B.

First, the substrate exchange operation of the substrate transfer robot of the comparative example is described. The substrate transfer robot of the comparative example has the same configuration as the substrate transfer robot 100 of this embodiment, but only differs in the substrate exchange operation from the substrate transfer robot 100 of this embodiment. Therefore, for convenience, the exchange operation of the substrate transfer robot of the comparative example is described below, also with reference to FIGS. 1(A), 1(B), and 2, in addition to FIGS. 4(A) to 4(F). The robot controller 20 of the comparative example operates the robot body 10, the upper substrate holding mechanism 40A, and the lower substrate holding mechanism 40B as follows.

First, the upper hand 4A and the lower hand 4B are positioned at the retreated position 201. In this state, in the upper hand 4A, the substrate is not placed on the substrate placing part 43A, and the upper substrate holding mechanism 40A is in a released state because the pressing part 42A is retreated. On the other hand, in the lower hand 4B, the substrate 61B is placed on the substrate placing part 43B, and the pressing part 42B of the lower substrate holding mechanism 40B is advanced to press the substrate 61B against the pair of positioning parts 41B. Therefore, the lower substrate holding mechanism 40B holds the substrate 61B (see FIG. 4(A)). Moreover, the processed substrate 61A is placed on the upper surface of the substrate placement body 55.

Next, the upper hand 4A is advanced to the advanced position 202 (see FIG. 4(B)).

Next, the upper hand 4A and the lower hand 4B are raised by a given raising height. This raising motion is performed by ascending the hoisting body 2. The given raising height is set so that the lower hand 4B is located higher than the upper surface of the substrate placement body 55. Therefore, the processed substrate 61A placed on the substrate placement body 55 is placed on the substrate placing part 43A of the upper hand 4A (see FIG. 4(C)).

Next, the upper hand 4A is retreated to the retreated position 201, and the lower hand 4B is advanced to the advanced position 202. Here, the upper substrate holding mechanism 40A of the upper hand 4A holds the substrate 61A. Moreover, the lower substrate holding mechanism 40B of the lower hand 4B releases the substrate 61B (see FIG. 4(D)).

Next, the upper hand 4A and the lower hand 4B are lowered by a given lowering height. This lowering motion is performed by descending the hoisting body 2. The given lowering height is set so that the lower hand 4B is located lower than the upper surface of the substrate placement body 55. Therefore, the unprocessed substrate 61B placed on the substrate placing part 43B of the lower hand 4b is placed on the upper surface of the substrate placement body 55 (see FIG. 4(E)).

Next, the lower hand 4B is retreated to the retreated position (see FIG. 4(F)).

Referring to FIG. 6, this substrate exchange operation includes operating sections A-E. In the operating section A, the upper hand 4A is advanced. In the operating section B, the upper hand 4A and the lower hand 4B are stopped and raised. In the operating section C, the upper hand 4A is retreated and the lower hand 4B is advanced. In the operating section D, the upper hand 4A and the lower hand 4B are stopped and lowered. In the operating section E, the lower hand 4B is retreated.

Speeds of the upper hand 4A and the lower hand 4B in each operating section (A, C, E) changes so as to include an accelerating section and a decelerating section before and after a constant-speed section, respectively. Therefore, an absolute value of the speed in the constant-speed section in each operating section is an absolute value of the maximum speed in each operating section of the upper hand 4A and the lower hand 4B. Further, absolute values of the maximum advancing and retreating speeds of the upper hand 4A (the absolute values of the speed in the constant-speed section) are the same as absolute values the maximum advancing and retreating speeds of the lower hand 4B (the absolutes value of the speed in the constant-speed section).

During such a substrate exchange operation of the comparative example, in the operating section B, when the processed substrate 61A is placed on the upper hand 4A, the upper hand 4A starts retreating immediately and then reaches the maximum speed for a short period of time. Therefore, when the absolute value of this maximum speed exceeds an absolute value of a speed at which the upper substrate holding mechanism 40A is able to stably hold the substrate 61A, the upper substrate holding mechanism 40A may fail to hold the substrate 61A.

Next, the substrate exchange operation of the substrate transfer robot 100 of this embodiment is described with reference to FIGS. 1(A) and 1(B), FIG. 2, and FIGS. 5(A) to 5(F). The robot controller 20 of the substrate transfer robot 100 of this embodiment operates the robot body 10, the upper substrate holding mechanism 40A, and the lower substrate holding mechanism 40B as follows.

Since operations of FIGS. 5(A) to 5(C) are the same as the operations of FIGS. 4(A) to 4(C) of the comparative example, description thereof is omitted.

As illustrated in FIG. 5(C), when the upper hand 4A and the lower hand 4B are raised by the given raising height, and the processed substrate 61A placed on the substrate placement body 55 is placed on the substrate placing part 43A of the upper hand 4A, the upper hand 4A is then retreated to a given position and the lower hand 4B is advanced to the advanced position 202. Here, the upper substrate holding mechanism 40A of the upper hand 4A holds the substrate 61A. Moreover, the lower substrate holding mechanism 40B of the lower hand 4B releases the substrate 61B (see FIG. 5(D)). The given position is suitably set in consideration of a retreating time, speed, etc. in the retreating operation of the upper hand 4A.

Next, the upper hand 4A and the lower hand 4B are stopped and lowered by the given lowering height. Therefore, the unprocessed substrate 61B placed on the substrate placing part 43B of the lower hand 4b is placed on the upper surface of the substrate placement body 55 (see FIG. 5(E)).

Next, the upper hand 4A and the lower hand 4B are retreated to the retreated position 201 (see FIG. 5(F)).

Referring to FIG. 7, this substrate exchange operation includes operating sections A-E, similar to the comparative example described above. Since the operating sections A and B are the same as the comparative example, description thereof is omitted. In the operating section C, the upper hand 4A is retreated to a given position, and the lower hand 4B is advanced. In the operating section D, the upper hand 4A and the lower hand 4B are stopped and lowered. In the operating section E, the upper hand 4A and the lower hand 4B are retreated.

Similarly to the substrate exchange operation of the comparative example, advancing and retreating speeds of the upper hand 4A and advancing and retreating speeds of the lower hand 4B change so that an accelerating section and a decelerating section are included before and after a constant-speed section. Therefore, in each operating section, an absolute value of the speed in the constant-speed section is an absolute value of the maximum speed in each operating section of the upper hand 4A and the lower hand 4B.

The absolute value of the maximum advancing speed of the upper hand 4A is the same as the absolute values of the maximum advancing and retreating speeds of the lower hand 4B. However, during the retreat of the upper hand 4A, the absolute value of the maximum speed in the operating section C is lower than the absolute value of the maximum speed in the operating section E. Moreover, the absolute value of the maximum speed of the upper hand 4A in the operating section C is lower than the absolute value of the maximum advancing speed of the upper hand 4A and the absolute values of the maximum advancing and retreating speeds of the lower hand 4B.

During this substrate exchange operation, the upper substrate holding mechanism 40A of the upper hand 4A grips (holds) the substrate 61A at an intermediate location in the operating section C. The gripping (holding) operation of the substrate 61A by the upper substrate holding mechanism 40A is desirably performed in a state where the substrate 61A is pressed against the pair of positioning parts 41A by an acceleration caused by the retreat of the upper hand 4A. Therefore, the gripping (holding) operation of the substrate 61A by the upper substrate holding mechanism 40A is performed, for example, in the operating section C in a state where the upper hand 4A becomes at the constant-speed state after being accelerated. A period of time after the upper hand 4A starts retreating until the gripping (holding) operation of the substrate 61A by the upper substrate holding mechanism 40A is ended is a first period. Moreover, a period of time after the first period is ended until the upper hand 4A is located at the retreated position 201 is a second period.

The absolute value of the maximum speed of the upper hand 4A during the first period (the absolute value of the speed in the constant-speed section of the operating section C (first maximum speed)) is set sufficiently lower than the absolute value of the maximum speed of the upper hand 4A during the second period (the absolute value of the speed in the constant-speed section of the operating section E (second maximum speed)).

Note that the absolute value of the speed of the upper hand 4A in the retreating operation may be set to various speeds, as long as the absolute value of the maximum speed during the first period is lower than the absolute value of the maximum speed during the second period. For example, in the operating section D, the upper hand 4A and the lower hand 4B may be lowered while retreating and advancing at low speed, without being stopped. Alternatively, the upper hand 4A may be gradually increased in the speed from the start of the retreat to just before the end of the retreat. Alternatively, in the operating section D, the upper substrate holding mechanism 40A may hold the substrate 61A.

According to this configuration, since the substrate 61A placed on the upper substrate placing part 43A is held by the upper substrate holding mechanism 40A during the retreating period of the upper hand 4A, the retreating time of the upper hand 4A can be shortened, as compared with a case where the upper substrate holding mechanism 40A holds the substrate 61A placed on the upper substrate placing part 43A while the upper hand 4A is stopped at the advanced position 202, and as a result, it can be prevented that the substrate transferring time becomes longer.

Moreover, during the retreating period of the upper hand 4A, the robot controller 20 causes the upper substrate holding mechanism 40A to hold the substrate 61A placed on the upper substrate placing part 43A. The robot controller 20 controls the speed of the upper hand 4A so that the absolute value of the maximum speed of the upper hand 4A during the first period after the upper hand 4A starts retreating until the substrate 61A is held by the upper substrate holding mechanism 40A is lower than the absolute value of the maximum speed of the upper hand 4A during the second period after the substrate 61A is held until the retreat of the upper hand 4A is ended. Therefore, by fully reducing the absolute value of the maximum speed during the first period as described above, the possibility that the upper substrate holding mechanism 40A fails to hold the substrate 61A placed on the upper substrate placing part 43A can be reduced. The "absolute value of the maximum speed which can reduce the possibility that the upper substrate holding mechanism 40A fails to hold the substrate 61A placed on the upper substrate placing part 43A" is set according to experiments, simulations, calculations, etc.

<Substrate Exchange Operation to Substrate Delivery Tub 53>

Next, the substrate exchange operation to the substrate delivery tub 53 is described.

In this substrate exchange operation, the lower hand 4B functions as the first hand, and the upper hand 4A functions as the second hand. In other words, this substrate exchange operation is fundamentally the same as the substrate exchange operation to the substrate treatment tub 52 described above, except for the upper hand 4A and the upper substrate holding mechanism 40A are replaced by the lower hand 4B and the lower substrate holding mechanism 40B, respectively, and the lower hand 4B and the lower substrate holding mechanism 40B are replaced by the upper hand 4A and the upper substrate holding mechanism 40A, respectively. Note that the "given lowering height" is set so that the upper hand 4A becomes lower than the upper surface of the substrate placement body 55.

When this substrate exchange operation is ended, as illustrated in FIG. 5(A), the unprocessed substrate 61B is placed on the lower substrate placing part 43B of the lower hand 4B which was empty as illustrated in FIG. 5(F), and the unprocessed substrate 61B is then gripped by the lower substrate holding mechanism 40B. At the same time, as illustrated in FIG. 5(A), the processed substrate 61A held by the upper substrate holding mechanism 40A of the upper hand 4A as illustrated in FIG. 5(F) is handed over, and the upper substrate holding mechanism 40A is released and the upper substrate placing part 43A becomes empty.

Then, the above substrate exchange operation is sequentially performed to each substrate treatment tub 52.

MODIFICATION

In one modification of this embodiment, when the robot controller 20 functions the upper hand 4A or the lower hand 4B as the first hand in the retreating operation of the upper hand 4A or the lower hand 4B, it may control the operation of the upper hand 4A or the lower hand 4B so that the absolute value of the maximum acceleration of the upper hand 4A or the lower hand 4B during the first period is lower than the absolute value of the maximum acceleration of the upper hand 4A or the lower hand 4B during the second period.

Also by this configuration, it can be prevented that the substrate transferring time becomes longer, and it can reduce the possibility that the upper substrate holding mechanism 40A or the lower substrate holding mechanism 40B fails to hold the substrate 61A placed on the upper substrate placing part 43A or the substrate 61B placed on the lower substrate placing part 43B.

As described above, as compared with the case where the upper substrate holding mechanism 40A or the lower substrate holding mechanism 40B holds the substrate placed on the upper substrate placing part 43A or the lower substrate placing part 43B, while the upper hand 4A and the lower hand 4B are stopped at the advanced position 202, according to this embodiment, the retreating time of the upper hand 4A or the lower hand 4B can be shortened, and as a result, it can be prevented that the substrate transferring time becomes longer. Moreover, when advancing and retreating the upper hand 4A and the lower hand 4B, it can reduce the possibility that the substrate holding mechanisms 40A and 40B fail to hold the substrate 61A and 61B, respectively.

Other Embodiments

The substrate transfer robot may be a single-arm robot.

Alternatively, in the above embodiment, the pair of arms of the substrate transfer robot 100 may be vertical articulated robotic arms.

Alternatively, in the substrate transfer robot 100 of the above embodiment, the pair of hands may be directly provided to the rotary body 2b without having the arms. In this case, the pair of hands are configured to be stacked in a vertical direction and are configured to be advanceable and retreatable in the substrate transferring direction.

The substrate transfer robot 100 may be used in operating environments other than the operating environment of the above embodiment. For example, it can be used for the substrate transferring operation by the two robots disclosed in JP2006-086294A.

Alternatively, the substrate may be other than the circular wafer. For example, the substrate may be a glass substrate for a liquid crystal display.

In the above embodiment, at least a part of the retreating operation of the upper hand 4A and at least a part of the retreating operation of the lower hand 4B are performed simultaneously (the operating section E of FIG. 7). Thus, the retreating time of the upper hand 4A during the substrate exchange operation can be increased. As a result, without increasing the time for the substrate exchange operation, the absolute value of the speed of the upper hand 4A in the retreating operation or the absolute value of the acceleration of the upper hand 4A in the retreating operation can be reduced. By reducing the absolute value of the speed or the acceleration of the upper hand 4A, it can be prevented that the substrate held by the upper hand 4A is offset from the upper hand 4A. The upper hand 4A in this case needs to have neither the gripping mechanism nor the suction mechanism. For example, the upper hand 4A may be a placement type hand in which the substrate is held only by a frictional force generated between the substrate and the hand by the weight of the substrate placed on the hand. Alternatively, it may be a drop-in type hand having neither the gripping mechanism nor the suction mechanism in which a wall extending vertically is provided so as to surround some or all of the side surface of the substrate placed on the hand, and the substrate is accommodated in an area surrounded by the wall, or may be a known Bernoulli type hand.

Moreover, at least a part of the advancing operation of the upper hand 4A and at least a part of the advancing operation of the lower hand 4B may be performed simultaneously by performing the advancing operation of the lower hand 4B in a part or all of the operating section A of FIG. 7. Thus, the advancing operation time of the lower hand 4B during the substrate exchange operation can be increased. As a result, without increasing the time for the substrate exchange operation, the absolute value of the speed of the lower hand 4B in the advancing operation can be reduced, or the absolute value of the acceleration of the lower hand 4B in the advancing operation can be reduced. By reducing the absolute value of the speed or the acceleration of the lower hand 4B, it can be prevented that the substrate held by the lower hand 4B is offset from the lower hand 4B. The lower hand 4B in this case needs to have neither the gripping mechanism nor the suction mechanism. For example, the lower hand 4B may be a placement type hand, or may be a drop-in type hand, or may be a known Bernoulli type hand.

During at least a part of the period of the substrate exchange operation, the operating direction of the upper hand 4A may be in agreement with the operating direction of the lower hand 4B.

The upper hand 4A may be retreated in the operating section D of FIG. 7, and the lower hand 4B may be advanced in the operating section B of FIG. 7.

It is apparent for the person skilled in the art that many improvements and other embodiments are possible from the above description. Therefore, the above description is to be interpreted only as illustration.

INDUSTRIAL APPLICABILITY

The substrate transfer robot and a method of controlling the same of the present disclosure are useful as the substrate transfer robot which includes the hand provided with the substrate holding mechanism, and the method of controlling the same, which can prevent that the substrate transferring time becomes longer and reduce the possibility that the substrate holding mechanism fails to hold the substrate when advancing and retreating the hand.

DESCRIPTION OF REFERENCE CHARACTERS

1 Pedestal
2 Hoisting Body
2a Elevatable Shaft
2b Rotary Body
3A Upper Arm
3B Lower Arm
4A Upper Hand
4B Lower Hand
10 Robot Body
20 Robot Controller
40A Upper Substrate Holding Mechanism
40B Lower Substrate Holding mechanism
41A, 41B Positioning Part
42A, 42B Pressing Part
43A Upper Substrate Placing Part
43B Lower Substrate Placing Part
51 Vacuum Chamber
52 Substrate Treatment Tub
53 Substrate Delivery Tub
55 Substrate Placement Body
100 Substrate Transfer Robot
200 Substrate Transferring Direction
201 Retreated Position
202 Advanced Position

What is claimed is:

1. A substrate transfer robot comprising:
a robot body including a first hand and a second hand, the first hand having a first substrate placing part on which a first substrate is placed and the second hand having a second substrate placing part on which a second substrate is placed, and the first hand and the second hand being capable of advancing and retreating; and
a robot controller configured to control operations of the first hand and the second hand,
wherein the robot controller performs a substrate exchange operation in which the first hand is operated so that the first hand is advanced while the first substrate is not placed on the first substrate placing part to place the first substrate placed on a substrate placement body on the first substrate placing part, and the first hand is then retreated, and the second hand is operated so that the second hand is advanced while the second substrate is placed on the second substrate placing part to place the second substrate placed on the second substrate placing part of the second hand on the substrate placement body, and the second hand is then retreated, wherein
a first part of the retreating operation of the first hand and a first part of the advancing operation of the second hand are performed simultaneously,
a second part of the retreating operation of the first hand and a first part of the retreating operation of the second hand are performed simultaneously, and
a speed of the first hand is controlled such that an absolute value of a maximum speed of the first hand in a period in which the first part of the retreating operation of the first hand and the first part of the advancing operation of the second hand are being performed simultaneously is lower than an absolute value of a maximum speed of the first hand in a period in which the second part of the retreating operation of the first hand and first part of the retreating operation of the second hand are being performed simultaneously.

2. The substrate transfer robot according to claim 1, wherein the speed of the first hand is controlled such that the absolute value of the maximum speed of the first hand in the period in which the first part of the retreating operation of the first hand and the first part of the advancing operation of the second hand are being performed simultaneously is lower than an absolute value of a maximum speed of the first hand in a period in which the first hand advances.

3. The substrate transfer robot according to claim 1, wherein the speed of the first hand and a speed of the second hand are controlled such that the absolute value of the maximum speed of the first hand in the period in which the part of the retreating operation of the first hand and the first part of the advancing operation of the second hand are being performed simultaneously is lower than an absolute value of a maximum speed of the second hand in the period in which the part of the retreating operation of the first hand and the first part of the advancing operation of the second hand are being performed simultaneously.

4. The substrate transfer robot according to claim 1, wherein the speed of the first hand and a speed of the second hand are controlled such that the absolute value of the maximum speed of the first hand in the period in which the part of the retreating operation of the first hand and the first part of the advancing operation of the second hand are being performed simultaneously is lower than an absolute value of a maximum speed of the second hand in a period in which the part of the retreating operation of the first hand and at least a part of the retreating operation of the second hand are being performed simultaneously.

5. The substrate transfer robot according to claim 1, wherein
the first hand includes a first substrate holding mechanism configured to hold and release the first substrate placed on the first substrate placing part,
the robot controller controls an operation of the first substrate holding mechanism, and
in the period in which the part of the retreating operation of the first hand and the first part of the advancing operation of the second hand are performed simultaneously, the robot controller makes the first substrate holding mechanism hold the first substrate placed on the first substrate placing part.

6. The substrate transfer robot according to claim 1, wherein
a first part of the advancing operation of the first hand and a second part of the advancing operation of the second hand are performed simultaneously, and
a first absolute value of a first maximum speed of the second hand during the advancing operation of the second hand is lower than a second absolute value of a second maximum speed during the advancing operation of the second hand when the second hand only advances during the first part of the advancing operation of the second hand.

7. A substrate transfer robot comprising:
a robot body including a first hand and a second hand, the first hand having a first substrate placing part on which a first substrate is placed and the second hand having a second substrate placing part on which a second substrate is placed, and the first hand and the second hand being capable of advancing and retreating; and
a robot controller configured to control operations of the first hand and the second hand, wherein
the robot controller performs a substrate exchange operation in which the first hand is operated so that the first hand is advanced while the first substrate is not placed on the first substrate placing part to place the first substrate placed on a substrate placement body on the first substrate placing part, and the first hand is then retreated, and the second hand is operated so that the second hand is advanced while the second substrate is placed on the second substrate placing part to place the second substrate placed on the second substrate placing part of the second hand on the substrate placement body, and the second hand is then retreated,
a first part of the retreating operation of the first hand and a first part of the advancing operation of the second hand are performed simultaneously, and
a second part of the retreating operation of the first hand and a first part of the retreating operation of the second hand are performed simultaneously,
a speed of the first hand is controlled, by the robot controller, such that an absolute value of a maximum speed of the first hand, in a first period in which the first part of the retreating operation of the first hand and the first part of the advancing operation of the second hand are being performed simultaneously, is lower than:
an absolute value of a maximum speed of the first hand during the advancing operation of the first hand and the retreating operation of the first hand,
an absolute value of a maximum speed of the second hand during the advancing operation of the second hand, and
an absolute value of a maximum speed of the second hand during the retreating operation of the second hand.

8. A method of controlling a substrate transfer robot, the substrate transfer robot including:
a robot body including a first hand and a second hand, the first hand having a first substrate placing part on which a first substrate is placed and the second hand having a second substrate placing part on which a second substrate is placed, and the first hand and the second hand being capable of advancing and retreating, and
a robot controller configured to control operations of the first hand and the second hand, wherein
the robot controller performs a substrate exchange operation in which the first hand is operated so that the first hand is advanced while the first substrate is not placed on the first substrate placing part to place the first substrate placed on a substrate placement body on the first substrate placing part, and the first hand is then retreated, and the second hand is operated so that the second hand is advanced while the second substrate is placed on the second substrate placing part to place the second substrate placed on the second substrate placing part of the second hand on the substrate placement body, and the second hand is then retreated,
a first part of the retreating operation of the first hand and a first part of the advancing operation of the second hand are performed simultaneously, and
a second part of the retreating operation of the first hand and a first part of the retreating operation of the second hand are performed simultaneously, the method including:
controlling, by the robot controller, a speed of the first hand such that an absolute value of a maximum speed of the first hand, in a first period in which the first part of the retreating operation of the first hand and the first part of the advancing operation of the second hand are being performed simultaneously, is lower than:
an absolute value of a maximum speed of the first hand during the advancing operation of the first hand and the retreating operation of the first hand,
an absolute value of a maximum speed of the second hand during the advancing operation of the second hand, and
an absolute value of a maximum speed of the second hand during the retreating operation of the second hand.

\* \* \* \* \*